United States Patent [19]

Riahi

[11] Patent Number: 4,855,604
[45] Date of Patent: Aug. 8, 1989

[54] ION BEAM IMPLANT SYSTEM

[75] Inventor: Shantia Riahi, Vista, Calif.

[73] Assignee: Air Products and Chemicals, Inc., Allentown, Pa.

[21] Appl. No.: 947,914

[22] PCT Filed: May 17, 1985

[86] PCT No.: PCT/US85/00929
§ 371 Date: Mar. 17, 1987
§ 102(e) Date: Mar. 17, 1987

[87] PCT Pub. No.: WO86/06874
PCT Pub. Date: Nov. 20, 1986

[51] Int. Cl.⁴ .................. H01J 27/02; H01J 37/18; H01J 49/04
[52] U.S. Cl. .................. 250/492.2; 250/288; 250/423 R
[58] Field of Search ........... 250/492.2, 423 R, 288, 250/492.21, 492.2; 206/530, 531, 532, 524.8

[56] References Cited

U.S. PATENT DOCUMENTS

| | | | |
|---|---|---|---|
| 1,826,809 | 10/1931 | Metz | 206/530 |
| 2,882,410 | 4/1959 | Brobeck | 250/288 |
| 4,089,415 | 5/1978 | Laib | 206/532 |
| 4,134,514 | 1/1979 | Schumacher et al. | 220/859 |
| 4,298,037 | 11/1981 | Schumacher et al. | 141/1 |

FOREIGN PATENT DOCUMENTS 60-54150 3/1985 Japan.

OTHER PUBLICATIONS

Instruments and Experimental Techniques, vol. 24, No. 4, part 2, Jul./Aug. 1981, pp. 1008-1010, V. A. Nikitinskii et al, "Source of metal Ions".

Nuclear Instruments and Methods on Physics Research/B5, vol. 233, no. 2, Nov. 1984, pp. 193–199, Middleton, "A Review of ion sources for accelrator mass spectrometry".

Nuclear Instruments and Methods, vol. 84, No.2, 1970, pp. 325-326, R. M. Allen, "The use of compound semiconductors in a sputtering ion source for ion implantation".

Primary Examiner—Jack I. Berman
Attorney, Agent, or Firm—James C. Simmons

[57] ABSTRACT

A charge forming system and apparatus for introducing ion source materials into the ion source vaporizer of an ion implant instrument is disclosed.

23 Claims, 1 Drawing Sheet

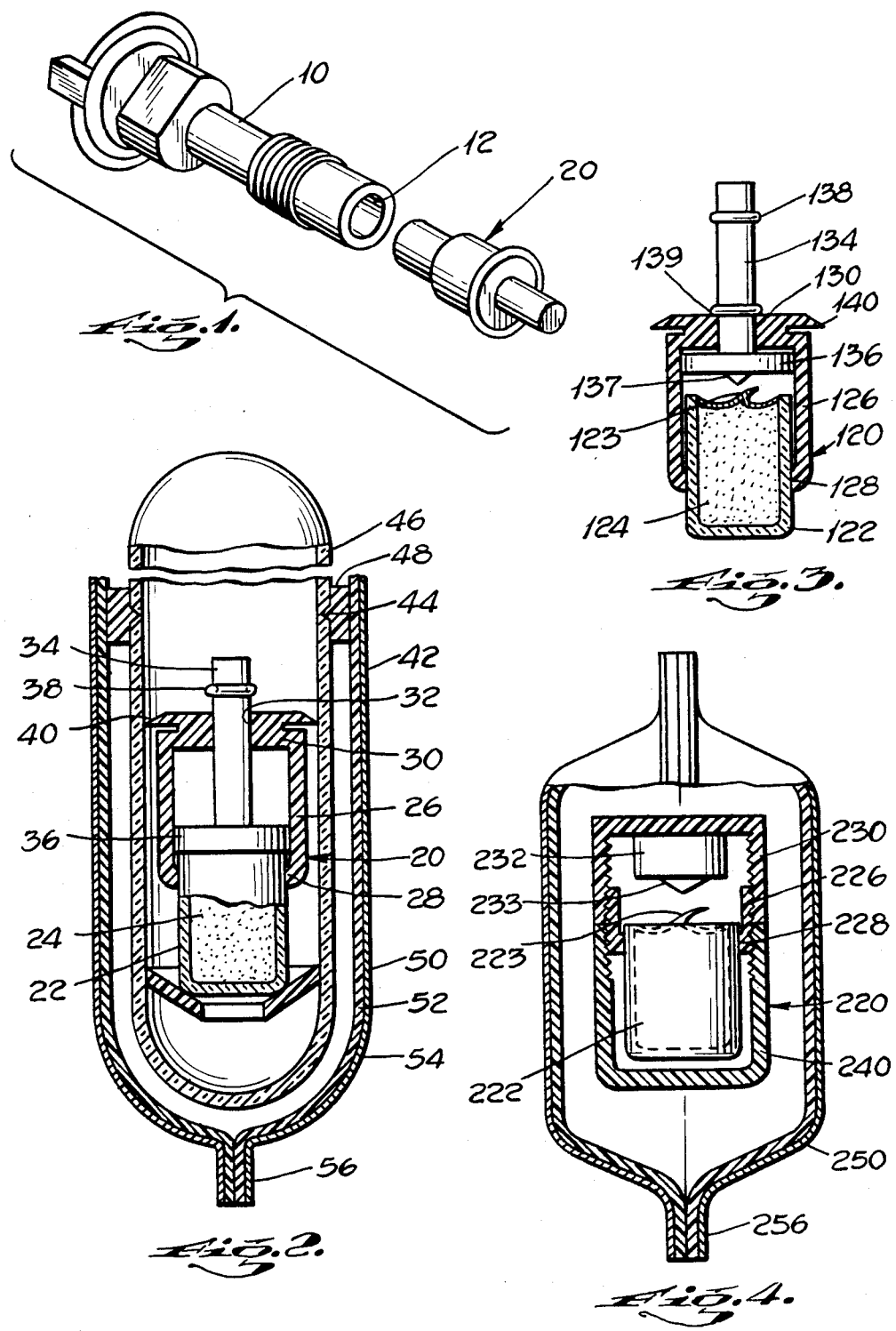

ION BEAM IMPLANT SYSTEM

FIELD OF THE INVENTION

This invention relates to ion implantation generally and more specifically relates to the manufacture of semiconductor devices using ion implant techniques.

BACKGROUND OF THE INVENTION

Ion implantation is a well-known and widely used process for injecting atoms into a solid material to selected depths and concentrations in selected areas. Ion implant accelerators are similar to isotope separators but typically have an added acceleration stage and field controls for precisely locating the beam of ions and controlling the energy and flux of the beam of ions to cause the desired penetration and concentration. Atoms of the selected chemical element to be ionized are ionized by collisions with electrons in an electrical discharge in a gas at low pressure and pass through an orifice into a high-vacuum region where they are accelerated by an electric field to a an intermediate energy, typically from 10 to 30 ke V, where they are analyzed by a magnetic field based upon the e/m ratio, i.e. the ratio of electronic charge over mass. The selected ion beam passes through an analyzer slit, and the ions are accelerated to the desired energy, and the beam passes through a refocussing field, typically a quadrupole lens, is deflected by a scanner system, and collimated by a defined aperture and allowed to strike the target. When the ions penetrate the target lattice, they lose energy through collisions with lattice atoms and come to rest as part of the target. There are, of course, a large number of variations between specific ion implant systems but the foregoing principles apply generally to ion implant processes. The ion implant technique is described, inter alia, in U.S. Pat. Nos. 2,750,541, 2,787,564 and 2,842,466, which are incorporated herein. The ion implant method is also described in many texts, encyclpedias and scientific journals; see, e.g. ENCYCLOPEDIA OF SEMICONDUCTOR TECHNOLOGY, "*Ion Implantation*" pp. 397–410, John Wiley & Sons (1984) and the numerous references cited therein; see also, Kirk Othmer CONCISE ENCYCLOPEDIA OF CHEMICAL TECHNOLOGY, "*Ion Implantation*", p. 666 et seq., John Wiley & Sons (1985); and ION IMPLANTATION, J. K. Hirvonen, ed., Academic Press, Inc., (1980). Since the equipment and methods of ion implantation are so thoroughly described and widely used in the semiconductor industry, those skilled in the are are familiar with these methods and devices and may refer to any of the many excellent journal, text and patent descriptions for details. Manufacturer's manuals, provided with specific items of equipment are the best source for details as to a given piece of equipment.

Ions are introduced into the ion implant equipment periodically. This generally requires cooling the implant equipment down, opening the high vacuum to at least some atmospheric exposure, introducing the new charge of ion source material into a receptacle, closing up the equipment, pumping the ion implant and accelorator chambers down to a high vacuum, and placing the equipment into operation again. This procedure is necessarily very expensive in terms of lost production and wasted time in a very expensive piece of equipment. Ion implant devices not infrequently cost over one million dollars and it is necessary to maximize production to recoup the investment in saleable product.

While the ion implant equipment is very precise, elegant and complex in design and operation, the introduction of ion source material is a relatively simple, largely manual operation. Basically, the charge of ion source material is, according to the prior art, simply pushed, poured or dropped into a small chamber in a Source Vaporizor which is then closed, after which the entire system is pumped down using well-known rotary and oil diffusion vacuum pumps. Source Vaporizers of the type under consideration are sold by various manufacturers, one of which is described as a Nova NV-10 (TM) Series Source Vaporizer. This, however, is merely exemplary and other source vaporizers are well-known to those skilled in the art.

For more than a decade, ion implantation has been a chief step in the industrial processing of semiconductor devices; in particular, large-scale integrated circuits; see, for example, ION IMPLANTATION IN SEMICONDUCTORS, Sartwell, et al., editors, Plenum Press, New York (1977). It is within this art that the present invention lies and to which it is an improvement.

SUMMARY OF THE INVENTION

The present invention is an improvement in the ion implantation process and apparatus described above, the improvement comprising a compact, safe system and apparatus for introducing ion source material into the source vaporizer of an ion implant instrument.

As an article of manufacture, this invention comprises a charge of ion source material configured and dimensioned to be recieved in an ion source vaporizer secured to means for inserting the charge into an ion source vaporizer of an ion implant device. As an article of manufacture, trade and commerce, the invention thus, in an exemplary form, comprises, in combination, a charge of ion implant material, charge forming means configuring the charge into a size and shape for being receiving in a source vaporizer of an ion implant instrument, and enclosure means for enclosing at least a portion of the charge forming means and for positioning the charge forming means in the well of a source vaporizer.

In one exemplary embodiment, the present invention may be described as ion source insertion means for loading an ion source into a source vaporizer of an ion implant instrument comprising: (a) source forming means for containing, protecting and configuring source material into a configuration which is substantially the size and configuration of the source receptacle in the source vaporizer, the source forming means having a generally cylindrical wall, a bottom and a top, and optionally including a breakseal hermetically sealing the top against contact with the atmosphere; (b) enclosure means for the source forming means for enclosing at least a substantial portion of the cylindrical wall portions thereof, the enclosure means including means snuggly fitting around the cylindrical wall of the source forming means permitting the source forming means to move under applied force reciprocally in the enclosure means; and (c) moving means in the enclosure means for applying moving force to the source forming means for moving the source forming means out of the enclosure means and optionally for rupturing the breakseal on the source forming means, the combination of source forming means, enclosure means and moving means, substantially preventing the source material in the source forming means from contact with the atmosphere.

The invention may, optionally, comprise, external container means hermetically sealing the entire source insertion means from contact with atmosphere. The external external container means may, optionally for all embodiments, comprise a flexible package formed of a polymer film having thereon a layer of metal hermetically sealing the ion source insertion means from the atmosphere, or a sealed tube with a breakable portion therein to permit the tube to be broken, upon application of force, in the breakable portion, or both of these outer packages.

Where a breakable tube is used, the source forming means further comprises a flange resiliently sealing against the internal wall of the tube.

There is considerable advantage when the means snuggly fitting around the cylindrical wall of the source forming means forms a substantially fluid tight seal therewith.

In some embodiments, the enclosure has generally cylindrical internal walls and the moving means comprises a generally discoid piston movably sealing in substantially fluid tight relation with the internal walls of the enclosure means.

The invention of may, additionally, comprise a semi-rigid ring encircling the tube in contact with the breakable portion to assure that when the tube is broke it breaks cleanly at the breakable portion.

These and other exemplary facets of the invention are more clearly shown and discussed in the drawing and in the specification.

BRIEF DESCRIPTION OF THE DRAWING

FIG. 1 is a perspective, exploded view of a preferred form of the article of manufacture of this invention, a charge for introduction into a source vaporizer of an ion implant instrument, showing a portion of the source vaporizer.

FIG. 2 is a side view, enlarged and partially cut away, showing partially in cross-section the article of manufacture of this invention.

FIG. 3 is a partial side view of an alternative embodiment of the manufacture of this invention wherein the charge container includes a breakseal.

FIG. 4 is another alternative embodiment of the manufacture of the present invention.

DESCRIPTION OF THE PREFERRED EMBODIMENT

The invention comprises, in the form of an article of manufacture, comprises apparatus for providing ion source material to the source vaporizer of ion implant equipment, an exemplary source vaporizer being depicted at 10 in FIG. 1 comprising a body of well-known configuration and a well 12 which is configured, designed and adapted to receive a charge of the ion source material. The well 12 is about 22 mm in depth and 16 mm in diameter and generally cylindrical in configuration. The article of manufacture 20 shown in FIG. 1 is one feature of the present invention, providing means for providing ion source material into the source vaporizer.

Referring to FIG. 2 next, a preferred, complete article of manufacture is depicted. The assembly 20 comprises a charge forming device 22 which holds the charge 24 of ion source material in its desired configuration and protects it from contamination. The charge forming device 22 is preferably formed of quartz, although for certain low temperature applications it may be formed of inert polymer or borosilicate glass. The charge forming device 22 is, in the embodiment of FIG. 1, an open top right cylindrical vessel being so configured and dimensioned as to be loosely received in the well of the vaporizer.

The charge forming device is received in an enclosure 26 which comprises a generally cylindrical receiving body having an opening 28 which includes a sealing ring which fits very snuggly around and seals against the outer cylindrical walls of the charge forming device 22, permitting the charge forming device 22, upon the application of force, to move recipically in the enclosure 26 with the walls thereof in sealing relationship therewith.

The enclosure 26 is generally in the form of a hollow cylinder formed of suitable inert polymer, preferably a fluorocarbon or fluorochlorocarbon polymer, such as Teflon (TM) for example, which is self-lubricating and forms an excellent seal with quartz, glass or metal. One end of the cylinder of the enclosure 26 comprises an end cap 30 which has a passage 32 therethrough slidably receiving the shaft 34 which, in turn, is part of a plunger or piston, the distal portion being generally discoid in configuration, as shown at 36, and forming a seal against the interior walls of the enclosure 26. The enclosure assembly 26–36 may, then, be described as a piston and cylinder arrangement in which the cylinder is formed by the enclosure 26 and the piston is formed by the shaft or plunger 34 and discoid piston 36. An "O" ring 38 in a groove in the plunger forms a stop against excessive travel of the piston. The enclosure also includes, in a preferred form, a sealing flange 40 which, during shipping and storage, positions the charge forming device and enclosure inside a protective cylinder 42 and which maintains a seal with the walls of the cylinder 42 after the cylinder is opened.

The manufacture may be contained in any number of protective envelopes, but in the preferred embodiment the entire assembly 20 is stored, shipped and handled before use in a glass or quartz cylindrical tube 42 which is hermetically sealed at both ends, enclosing the assembly 20 inside in inert atmosphere, and which includes a scribe mark 44 which permits the tube to be easily broken, allowing the upper portion 46, as shown, to be removed and permitting removal of the assembly 22. A protective ring 48 formed of a semi-rigid, self-lubricating polymer such as Ryton (TM) polysulfide is a desired but non-critical feature of the invention. This ring includes, preferably, a projection which extends into the scribe 44 to assure a safe, clean break.

Finally, the overall assembly 22 and its protective tube 42 is packaged in an inert atmosphere contained in a moisture and vapor impervious flexible package 50 formed of a layer of Mylar (TM) polyterephthalate 52 and metal, such as vapor deposited aluminum 54, sealed in any convenient way as shown, simply as an example, at 56.

FIG. 3 depicts a highly desirable alternative of the assembly of the invention for forming and loading a charge of ion source material which is exceptionally sensitive to contamination or which is to be given ultimate purity protection. In this assembly 120, the charge forming device 122 is the same in all essential features as the device 22 except that it includes a quartz (or in some instances polymeric or borosilicate) seal 123 which hermetically seals the ion source material 124 in the charge shape and size. The enclosure 126-130 is the same as described respecting enclosure 26-30 and the piston 134-136 is the same as described respecting piston 134-136, but has the added structure of a breakpoint 137 on the distal side of the piston 136 and may include an additional "O" ring stop 139 to prevent accidental movement of the piston. The operation, which will be described, is the same for this embodiment as for that of FIG. 2 except that the first "O" ring 139 is removed and the breakpoint 137 contracts and breaks the breakseal 123 in the early stages of movement of the piston in the cylinder.

FIG. 4 depicts another alternative embodiment. In this assembly 220, the charge forming device 222 includes a breakseal 223 and is the same as the device 122-123. The charge forming device is received in a cylindrical enclosure portion 226 which seals at 228, as described with respect to the opening 28 and 128 in the earlier described embodiments. Projections or keys 129 may be provided in this embodiment for engaging the thermal source evaporator 10 to prevent relative rotation therewith. The enclosure portion includes threads on the outside and a cap 230 which includes an interior structure 232 for engaging the charge forming device and a breakpoint 233 for contacting and ruptureing the breakseal 223. While not necessary, it is sometimes desirable to include a bottom or distal cap 240 which slips on or screws on to the enclosure portion 226, providing an extra measure of protection. The entire assembly may then be enclosed in a glass or quartz tube as described and in an envelope or, as depicted in FIG. 4, simply enclosed in a vapor barrier envelope 250 sealed at 256, of the construction described. It is customary to carry out the process of ion implantation by the general steps of (a) evaporating a source material; (b) ionizing at least one component of the source material; (c) accelerating the resulting ions; (d) electromagnetically selecting the ions to be implanted in the target; and (e) accelerating and directing a beam of the selected ions to a predetermined point or location on the target. The improvement of this invention is in the first step of evaporating a source material and in a preliminary step of providing a source material, and, more particularly in the configuration, structure, operation, function and design of an article of manufacture for charging an ion source vaporizer.

As background for understanding the significance and importance of this invention, a brief discussion of some factors of great practical and economic, as well as technical, importance is in order.

The ion implant instrument is very expensive, costing a million dollars or more typically, a down-time or non-productive time must, for economic soundness, be avoided and minimized to the greatest possible extent. Down time results whenever it is necessary to shut the instrument down to recharge it with ion source material. In many instances in the prior art, the source vaporizer must be scraped out and a weighed or measured amount of ion source introducted into the well of the source vaporizer. In most instances, this requires that the source vaporizer be introduced into a clean-room or glovebox to prevent contamination of the reagents and spread of the reagents, some of which are extremely poisonous or otherwise hazardous. Those who have worked in a glove box will appreciate that this is a very time consuming and inconvenient operation.

After the charge is loaded into the source vaporizer, the instrument, which operates at high vacuum and an ambient operating temperature of from about 100° to 300° C. must be pumped down and brought up to operating temperature, all of which consumes substantial periods of time. The instrument spectrographic and accelerating chamber operates, for example, at vacuums of as low as $10^{-5}$ torr. The introduction of a charge which requires extensive outgassing or which introduces volatile impurities can slow the start-up of the ion implant instrument significantly. In addition, if the instrument is required to operate at high temperatures, e.g., above 300° C., additional time is required to bring the instrument to a stable operating temperature and additional pumping time may be required.

It is, therefore, a highly sought after goal and a long felt need in the industry to find a method which will reduce down-time, minimize start-up time, and extend run-time between recharging the ion source.

Safety is also a very important consideration. It would be desirable to have an ion source which can be handled safely without extreme or unusual precautions or undue risk and which, upon being used up, it easily removed and safely handled.

The article of manufacture is used in the following manner. First, once the source vaporizer is prepared to recieve a charge, the article 20, 120 and 220 is taken from its protective package(s), depending upon the form of packaging used. The article is positioned as shown in FIG. 1 with the source defining device 22 adjacent the well 12 in the source vaporizer, the distal end thereof is then inserted into the well and the article 20 is pressed snuggly against the source vaporizer. In the case of the embodiments of FIGS. 1 and 2, the piston is pressed forcing the charge forming device and charge into the well and, in the case of the article 120, breaking the seal 123 thus opening the charge for use. The article 220 is handled basically in the same way, except that the lid 230 is turned to break the seal 223. This takes only a few seconds and the vaporizer is secured in the ion implant instrument, in the usual and conventional manner, and the ion implant instrument is put back into normal operation. Upon completion of the run, the charge forming device contains the residual material from the charge and the charge forming device is simply poured back into the container and disposed of according to regulations which may apply to the particular facility and material.

There are many and important advantages to the present invention, only some of which are discussed in any degree or particularity here.

First, it will be apparent that the clean-up of the ion source vaporizer is greatly simplified. Whereas in the prior art it was often necessary to hand-scrape residue out of the well, some of which residues being poisonous or hazardous, the residue and the charge forming means are simply allowed to fall out of the well and may be returned to the original container for disposal.

This is a much quicker, simpler and cleaner approach than the prior art, and a very much safer procedure.

The charge forming means permits the very convenient use of fine powders with high surface areas as charge materials, rather than plugs or chunks of material. This results in better, more stable and more controllable ion source material vaporization and the use of materials which would otherwise not be acceptable as source materials.

The present invention reduces down-time and permits more rapid start-up after the source is renewed because fewer impurities are introduced, there is virtually no handling of any part of the charge or its associated components. This, of course, is also a safety feature.

Ultra-high purity reagent quality can be maintained since the source material is hermetically sealed from atmospheric and other contamination, and yet is easily and safety handled.

Shipping and handling safety are greatly enhanced. No longer is it necessary to handle open reagents or to use cumbersome gloveboxes to protect reagents from contamination or operators from toxicity.

Purity is assured because the source forming means serves to protect and contain the source material at all stages from packing, which can be in ultimately clean environments, through shipping, storage and even in use.

Other advantages will appear to those who have struggled with the prior art apparatus, systems and methods.

While the invention has been described with reference to the semiconducter industry and in the manufacture of semiconductor materials, e.g. boron implanted into silicon, the invention is of general applicability in, for example, forming corrosion or wear resistant surfaces on bearings, cutting tools, and the like.

Furthermore, while the invention has been described in terms of particular materials of composition, construction and configuration, these are merely exemplary and great variation is permited, as these are not critical, within the scope, concept and claims of the invention without departing from equivalents of examples and principles hereinbefore setforth.

INDUSTRIAL APPLICATION

This invention finds its most direct and immediate application in the manufacture of semiconductor devices, cutting tools, bearings and other metal objects in which surface characteristics are modified by ion implantation.

What is claimed is:

1. An ion source insertion means for loading an ion source into a source vaporizer of an ion implant instrument comprising, in combination:
   (a) source forming means for containing, protecting and configuring source material into a configuration which is substantially the size and configuration of the source receptacle in the source vaporizer, the source forming means having a generally cylindrical wall, a bottom and a top, and including a breakseal hermetically sealing the top against contact with the atmosphere;
   (b) enclosure means for the source forming means for enclosing at least a substantial portion of the cylindrical wall portions thereof, the enclosure means including means snuggly fitting around the cylindrical wall of the source forming means forming a sliding seal therewith for permitting the source forming means to move under applied force reciprocally in the enclosure means; and
   (c) moving means in the enclosure means for applying moving force to the source forming means for moving the source forming means out of the enclosure means and for rupturing the breakseal on the source forming means;
   the combination of source forming means, enclosure means and moving means, substantially preventing the source material in the source forming means from coming in contact with the atmosphere.

2. The ion source insertion means of claim 1 further comprising external container means hermetically sealing the entire source insertion means from contact with atmosphere.

3. The ion source insertion means of claim 2 wherein said external container means comprises a flexible package formed of a polymer film having thereon a layer of metal hermetically sealing the ion source insertion means from the atmosphere.

4. The ion source insertion means of claim 2 wherein the external container means comprises a sealed tube with a breakable portion therein to permit the tube to be broken, upon application of force, in the breakable portion.

5. The ion source insertion means of claim 4 wherein the source forming means further comprises a flange resiliently sealing against the internal wall of the tube.

6. The ion source insertion means of claim 1 wherein said enclosure has generally cylindrical internal walls and wherein the moving means comprises a generally discoid piston which moves in substantially fluid tight relation with the internal walls of the enclosure means.

7. The ion source insertion means of claim 1 wherein said enclosure has generally cylindrical internal walls and wherein the moving means comprises a generally discoid piston which moves in substantially fluid tight relation with the internal walls of the enclosure means.

8. The ion source insertion means of claim 7 further comprising external container means hermetically sealing the entire source insertion means from contact with atmosphere.

9. The ion source insertion means of claim 8 wherein external container means comprises a flexible package forming of a polymer film having thereon a layer of metal hermetically sealing the ion source insertion means from the atmosphere.

10. The ion source insertion means of claim 8 further comprising a hermetically sealed container for the source introducing device comprising a sealed tube with a breakable portion therein which breaks upon the application of force to permit the tube to be broken, upon application of force to the breakable portion.

11. The ion source insertion means of claim 10 wherein the source forming means further comprises a flange resiliently sealing against the internal wall of the tube.

12. The ion source insertion means of claim 10 further comprising a semi-rigid ring encircling the tube in contact with the breakable portion to assure that when the tube is broken it breaks cleanly at the breakable portion.

13. An ion source insertion means for loading an ion source into a source vaporizer of an ion implant instrument comprising, in combination:
   (a) source forming means for containing, protecting and configuring source material into a configuration which is substantially the size and configuration of the source receptacle in the source vaporizer, the source forming means having a generally cylindrical wall, a bottom and a top, and including a breakseal hermetically sealing the top against contact with the atmosphere;
   (b) enclosure means for the source forming means for enclosing at least a substantial portion of the cylindrical wall portions thereof, the enclosure means including means snuggly fitting around the cylindrical wall of the source forming means forming a sliding seal therewith for permitting the source forming means to move under applied force reciprocally in the enclosure means; and (c) moving means moveably associated with the enclosure means for applying moving force to the source forming means for moving the source forming means out of the enclosure means and for rupturing the breakseal on the source forming means;

the combination of source forming means, enclosure means and moving means, substantially preventing the source material in the source forming means from coming in contact with the atmosphere.

14. The ion source insertion means of claim 13 further comprising external container means hermetically sealing the entire source insertion means from contact with atmosphere.

15. The ion source insertion means of claim 14 wherein external container means comprises a flexible package formed of a polymer film having thereon a layer of metal hermetically sealing the ion source insertion means from the atmosphere.

16. The ion source insertion means of claim 14 further comprising a hermetically sealed container for the source introducing device comprising a sealed tube with a breakable portion therein which breaks upon the application of force to permit the tube to be broken, upon application of force to the breakable portion.

17. The ion source insertion means of claim 16 further comprising a semi-rigid ring encircling the tube in contact with the breakable portion to assure that when the tube is broken it breaks cleanly at the breakable portion.

18. A device for introducing a hermetically encapsulated thermally volatile ionizable source material into the source vaporizer (10, 12) of an evacuated ion implant instrument characterized in that the source material is hermetically encapsulated in a cylindrical capsule (22, 122, 222) of chemically inert material selected from the group consisting of glass, quartz and polymer having an openable proximal end (123, 223), and the device comprises an enclosure (26, 126, 226) having an annular distal end (28, 128, 228) which slidably seals against the cylindrical outer surface of the capsule, a plunger (32, 132, 232) on the proximal end (30, 130, 230) of the enclosure mounted for movement relative to the capsule for contacting and moving the proximal end of the capsule for pushing the capsule from the enclosure and opening the capsule to permit vaporization of the source (24, 124) in the capsule into the evacuated ion implant instrument, the enclosure being so configured and constructed as to be received in the source vaporizer (12) of the implant instrument.

19. The device of claim 18 wherein the plunger comprises a piston (36) which hermetically closes and seals the proximal end of the capsule.

20. The device of claim 18 wherein the proximal end of the capsule is a frangible seal (123, 223) hermetically sealing the capsule and the plunger is configured and constructed to rupture the frangible seal upon movement by the plunger.

21. The device of claim 20 wherein the capsule is formed of fused quartz or glass and the proximal end is a breakseal.

22. The device of claim 18 further comprising a flexible package formed of a polymer film having thereon a layer of metal hermetically sealing the ion source introducing device from the atmosphere.

23. The device of claim 18 further comprising a hermetically sealed container for the source introducing device comprising a sealed tube with a breakable portion therein which breaks upon the application of force to permit the tube to be broken, upon application of force to the breakable portion.

* * * * *